US012764432B2

(12) United States Patent
Liu et al.

(10) Patent No.: US 12,764,432 B2
(45) **Date of Patent: *Oct. 13, 2026**

(54) TIME DELAY INTEGRATION SENSOR WITH INCREASED APERTURE AREA

(71) Applicants: PIXART IMAGING INC., Hsin-Chu County (TW); Taiwan Space Agency, Hsin-Chu City (TW)

(72) Inventors: Ren-Chieh Liu, Hsin-Chu County (TW); Yi-Che Yen, Hsin-Chu County (TW)

(73) Assignees: PIXART IMAGING INC., Hsin-Chu County (TW); Taiwan Space Agency, Hsin-Chu City (TW)

( * ) Notice: Subject to any disclaimer, the term of this patent is extended or adjusted under 35 U.S.C. 154(b) by 261 days.

This patent is subject to a terminal disclaimer.

(21) Appl. No.: 18/601,419

(22) Filed: Mar. 11, 2024

(65) Prior Publication Data

US 2025/0287117 A1 Sep. 11, 2025

(51) Int. Cl.

| | |
|---|---|
| ***H04N 25/531*** | (2023.01) |
| ***H04N 25/768*** | (2023.01) |
| ***H04N 25/78*** | (2023.01) |
| ***H10F 39/18*** | (2025.01) |

(52) U.S. Cl.

CPC ......... *H04N 25/531* (2023.01); *H04N 25/768* (2023.01); *H04N 25/78* (2023.01); *H10F 39/18* (2025.01)

(58) Field of Classification Search

None

See application file for complete search history.

(56) References Cited

U.S. PATENT DOCUMENTS

| | | | | |
|---|---|---|---|---|
| 9,148,601 | B2 | 9/2015 | Fox | |
| 11,336,843 | B2 * | 5/2022 | Liu | H04N 25/768 |
| 2009/0321800 | A1 * | 12/2009 | Ohkawa | H10F 39/802 257/E31.127 |
| 2021/0409630 | A1 * | 12/2021 | Liu | H04N 25/531 |
| 2023/0353902 | A1 | 11/2023 | Liu | |

* cited by examiner

*Primary Examiner* — Sinh Tran

(74) *Attorney, Agent, or Firm* — HAUPTMAN HAM, LLP

(57) ABSTRACT

The present disclosure provides a time delay integration (TDI) sensor using a rolling shutter. The TDI sensor includes multiple pixel columns. Each pixel column includes multiple pixel groups arranged in an along-track direction, wherein one pixel of each of the pixel groups in every pixel column has an extension in the along-track direction. The extension is equal to a pixel height without the extension multiplied by a time ratio of a line time difference of the rolling shutter and a frame period, or is a the pixel height divided by N, wherein N is a number of pixels in each pixel column.

20 Claims, 9 Drawing Sheets

TIME DELAY INTEGRATION SENSOR WITH INCREASED APERTURE AREA

BACKGROUND

1. Field of the Disclosure

This disclosure generally relates to a time delay integration (TDI) sensor and, more particularly, to a TDI Complementary Metal-Oxide-Semiconductor (CMOS) image sensor that implements the rolling shutter operation by spatial compensation.

2. Description of the Related Art

The time delay integration (TDI) sensor uses an area array image sensor to capture images from an imaging platform that is moving relative to the imaged object or scene at a constant speed. The TDI sensor is conceptually considered as the stack of linear arrays, wherein each linear array moves across a same point of the scene at a time period that the image sensor moves a distance of one pixel.

Conventionally, the charge-coupled device (CCD) technology has been used for TDI applications because CCDs intrinsically operate by shifting charge from pixel to pixel across the image sensor to allow charges between pixels to integrate when the image sensor moves across a same point of the imaged scene. However, CCD technology is relatively expensive to fabricate and CCD imaging devices consume relatively high power.

Although using a CMOS circuit can achieve lower power, higher degree of integration and higher speed, the existing designs suffer from higher noises. Although a 4-transistor (4T) structure can be used to minimize noises, the 4T pixels are clocked using a rolling shutter technique. Using the rolling shutter clocking can cause artifacts in the captured image since not all pixels are integrated over the same time period.

Therefore, U.S. Pat. No. 9,148,601 provides a CMOS image sensor for TDI imaging. Please refer to FIG. 1, the CMOS image sensor includes multiple pixel columns 112, and each pixel column is arranged to be parallel to an along-track direction $D_{a\_t}$. For compensating the integration interval of the rolling shutter of the CMOS image sensor, a physical offset 150 is further arranged between two adjacent pixels of each pixel column 112, wherein if the pixel column 112 has N rows, each physical offset 150 is equal to a pixel height divided by N.

Accordingly, the present disclosure further provides a TDI CMOS image sensor that implements the rolling shutter operation by spatial compensation.

SUMMARY

The present disclosure provides a TDI CMOS image sensor with a separation space determined according to the pixel height, the line time difference of a rolling shutter and the frame period.

The present disclosure further provides a TDI CMOS image sensor that changes the line time difference corresponding to different conditions with a fixed separation space.

The present disclosure provides a TDI CMOS image sensor that captures an image frame using a rolling shutter and moves with respect to a scene in an along-track direction. The image sensor includes a pixel array having multiple pixel columns. Each of the pixel columns includes multiple pixels arranged in the along-track direction, and one pixel of each pixel group of the multiple pixels has an extension in the along-track direction to compensate a line time difference of using the rolling shutter, wherein each pixel group has a first pixel and a second pixel.

The present disclosure further provides a TDI CMOS image sensor that captures an image frame using a rolling shutter and moves with respect to a scene in an along-track direction. The image sensor includes a pixel array having multiple pixel columns. Each of the pixel columns includes multiple pixels arranged in the along-track direction, and a first aperture area of a first pixel of each pixel group of the multiple pixels is longer than a second aperture area of a second pixel of the each pixel group by an extension in the along-track direction to compensate a line time difference of using the rolling shutter.

The present disclosure further provides an image sensor including a pixel array, a first readout circuit and a second readout circuit. The pixel array includes multiple pixel columns. Each of the multiple pixel columns includes multiple pixel groups. Each of the pixel groups includes a first pixel and a second pixel, wherein a first aperture area of the first pixel is longer than a second aperture area of the second pixel by an extension in a column direction of the multiple pixel columns. The first readout circuit is coupled to first pixels of the multiple pixel groups in the multiple pixel columns, and configured to read pixel data of the first pixels. The second readout circuit is coupled to second pixels of the multiple pixel groups in the multiple pixel columns, and configured to read pixel data of the second pixels.

In the present disclosure, the separation space is not directly related to a size of the pixel array (i.e. a number of pixels), and the separation space can be determined as long as the frame period and the line time difference have been determined.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The CMOS image sensor of the present disclosure compensates a line time difference in time delay integration (TDI) imaging using a rolling shutter by arranging a separation space between pixels in an along-track direction. Accordingly, pixel data corresponding to the same position of an imaged scene is integrated in successive image frames so as to increase the signal-to-noise ratio (SNR), wherein a number of integration is related to a size of pixel array.

The concept of TDI imaging is known to the art, and the present disclosure is to eliminate the imaging distortion generated in a TDI CMOS image sensor using rolling shutter technique.

Figure 1:
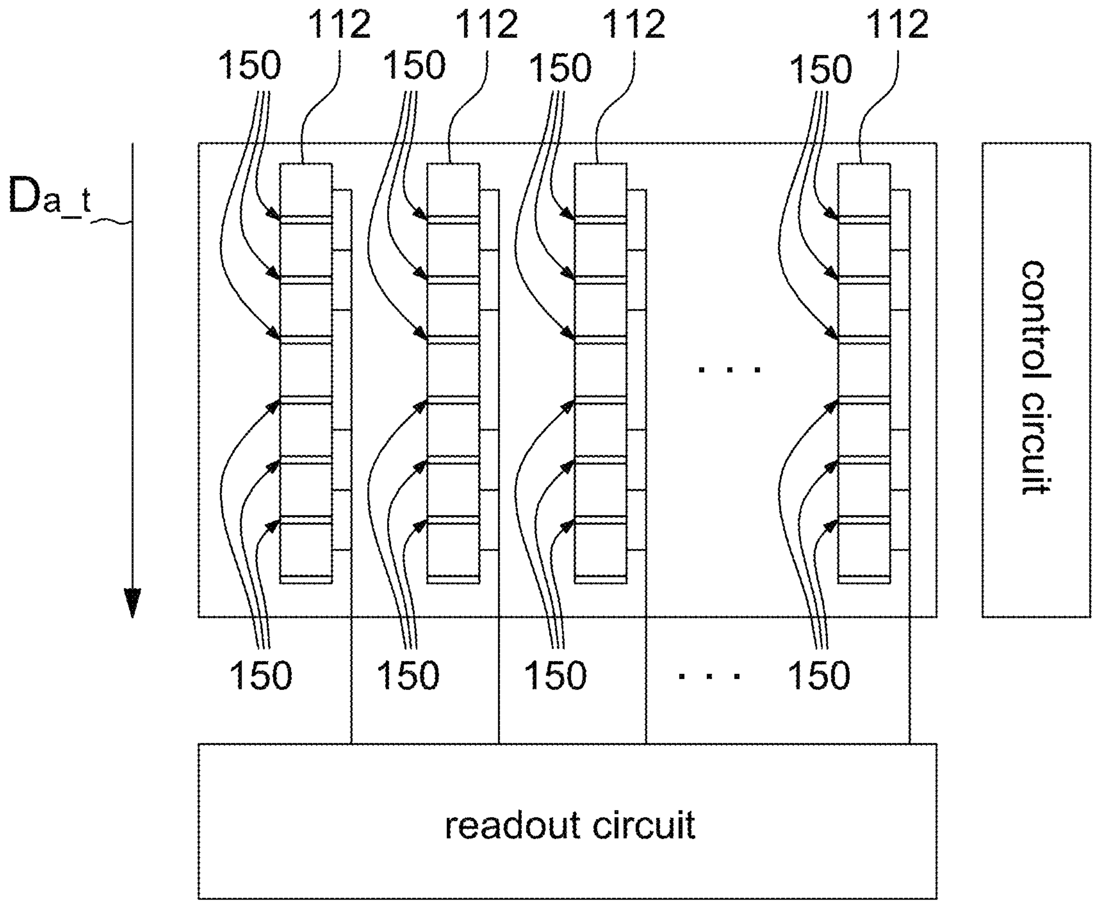
FIG. 1 (Prior Art)
FIG. 1 is a schematic diagram of a CMOS image sensor for time delay integration (TDI) imaging.
Figure 2:
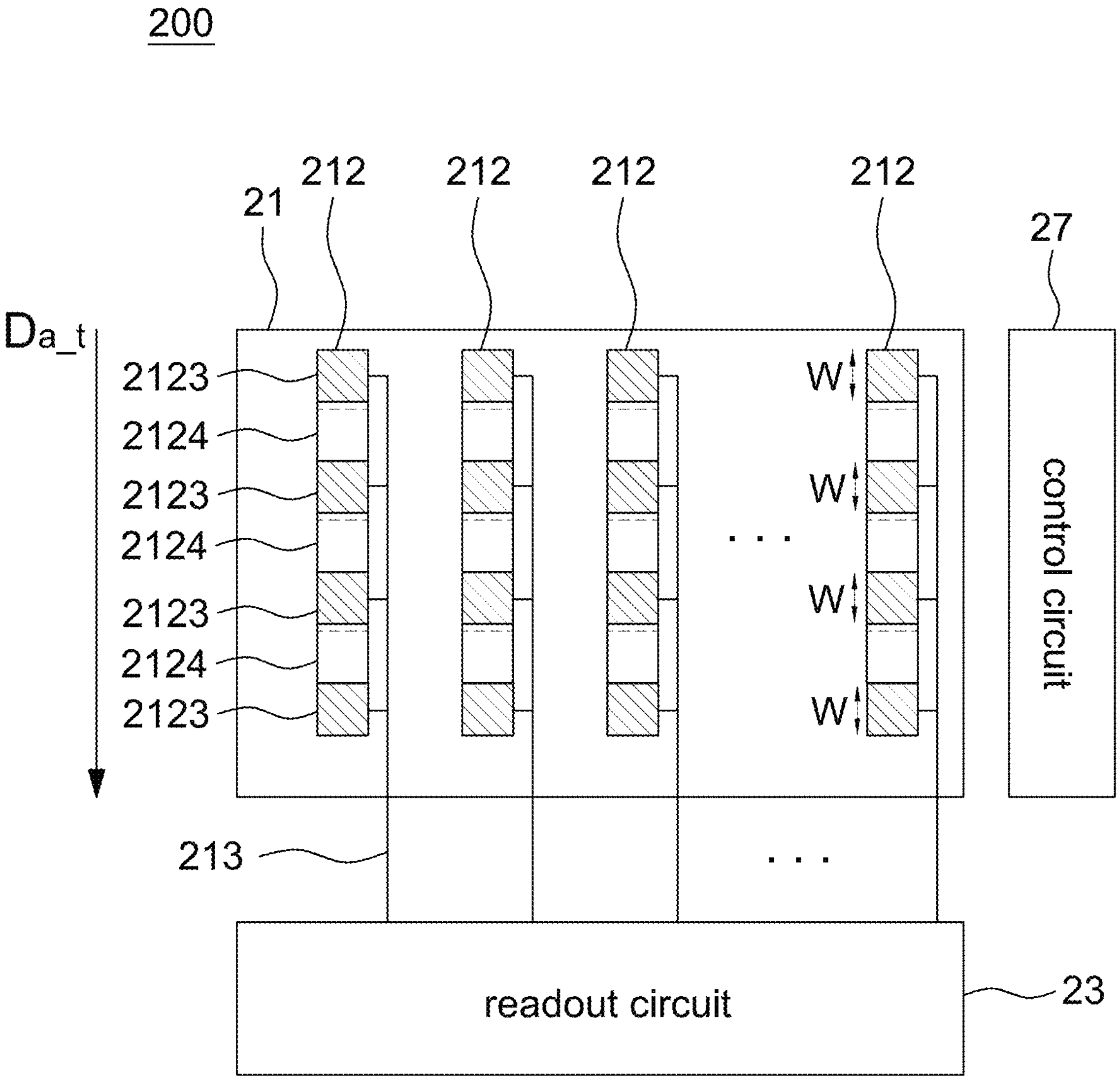
FIG. 2 is a schematic diagram of a TDI CMOS image sensor according to a first embodiment of the present disclosure.

Please refer to FIG. 2, it is a schematic diagram of a TDI CMOS image sensor 200 according to a first embodiment of the present disclosure. The TDI CMOS image sensor 200 captures image frames using a rolling shutter, and moves toward an along-track direction $D_{a\_t}$ with respect to a scene, wherein the scene is determined according to an application of the TDI CMOS image sensor 200. For example, when the TDI CMOS image sensor 200 is applied to a scanner, the scene is a scanned document; whereas, when the TDI CMOS image sensor 200 is applied to a satellite or aircraft, the scene is a ground surface.

The operation of the rolling shutter is known to the art, and thus details thereof are not described herein.

The TDI CMOS image sensor 200 includes a pixel array 21. The pixel array 21 includes multiple pixel columns 212. Each of the pixel columns 212 includes multiple pixels 2123 (e.g., shown as regions filled with slant lines herein) arranged in the along-track direction $D_{a\_t}$ (e.g., shown as a longitudinal direction of the pixel array 21). Two adjacent pixels of each pixel column 212 have a separation space 2124 (e.g., shown as blank regions herein) therebetween.

Figure 3:
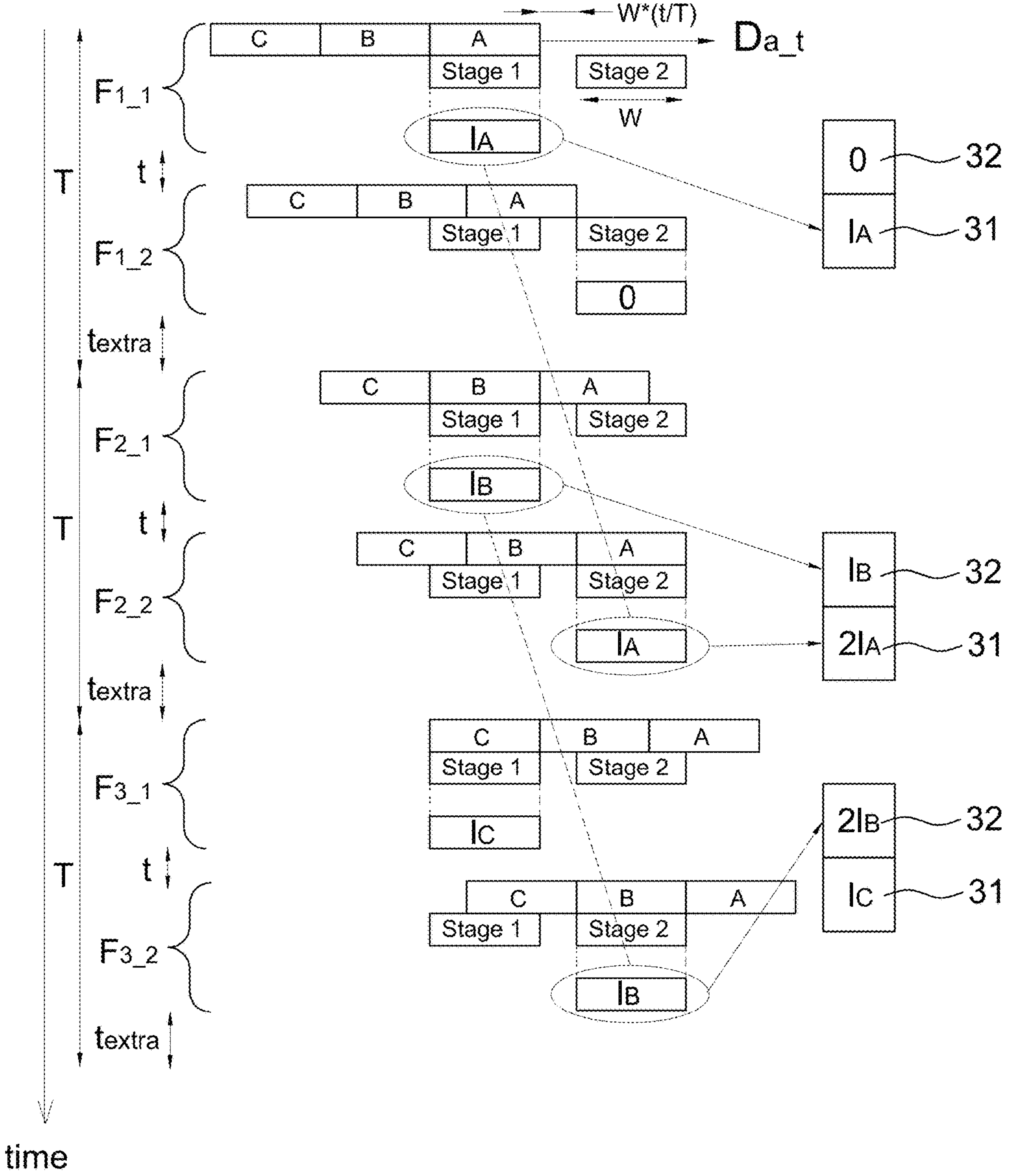
FIG. 3 is an operational schematic diagram of the TDI CMOS image sensor of FIG. 2.

Please refer to FIG. 3, it is an operational schematic diagram of the TDI CMOS image sensor 200 of FIG. 2. In one aspect, the separation space 2124 is equal to a multiplication of a pixel height W of one pixel 2123 in the along-track direction $D_{a\_t}$ by a time ratio of a line time difference t of the rolling shutter and a frame period T of capturing the image frame (e.g., FIG. 3 showing three image frames), i.e. separation space=W×t/T.

In the present disclosure, the line time difference t is a time interval between a time of starting or ending exposure of two adjacent pixel rows.

In FIG. 3, it is assumed that the scene includes 3 positions or objects A, B and C moving rightward (i.e. along-track direction $D_{a\_t}$). Stage1 and Stage2 indicate two pixel rows of each pixel column 212, wherein the separation space W×t/T is arranged between Stage1 and Stage2. In the present disclosure, the frame period T is determined according to brightness of the scene and a sensitivity of the pixel array 21. A moving speed of the TDI CMOS image sensor 200 is set as the pixel height W divided by the frame period T.

Because FIG. 3 assumes that the pixel column 212 of the pixel array 21 has two pixel rows, the frame period T, in which the TDI CMOS image sensor 200 captures one image frame, includes two line times, which have a line time difference t. Herein, a line time is referred to a processing time interval for accomplishing the exposing and reading of one pixel row. For example, FIG. 3 shows that a first image frame includes two pixel rows $F_{1\_1}$ and $F_{1\_2}$; a second image frame includes two pixel rows $F_{2\_1}$ and $F_{2\_2}$; and a third image frame includes two pixel rows $F_{3\_1}$ and $F_{3\_2}$.

In this embodiment, the TDI CMOS image sensor 200 further includes multiple integrators, e.g., FIG. 3 showing two integrators 31 and 32, wherein the integrators are, for example, a buffer (i.e. digital integrator) or a capacitor (i.e. analog integrator), and a number of the integrators are preferably corresponding to a number of pixel columns 212 so as to determine a width of the imaged scene. The integrators 31 and 32 are respectively used to integrate pixel data in adjacent image frames corresponding to a same position or object of the scene.

For example, in the first image frame (e.g., including $F_{1\_1}$ and $F_{1\_2}$), Stage1 senses pixel data of the position or object A of the scene, and integrates (or adds) to the integrator 31, e.g., shown as $I_A$; now, the integrator 32 does not yet integrate (or store) any pixel data, e.g., shown as 0.

As the scene moves in the along-track direction $D_{a\_t}$ at a speed W/T, in the second image frame (e.g., including $F_{2\_1}$ and $F_{2\_2}$), Stage1 senses pixel data of the position or object B of the scene, and integrates (or adds) to the integrator 32, e.g., shown as Is; and Stage2 senses pixel data of the position or object A of the scene, and integrates (or adds) to the integrator 31, e.g., shown as $2I_A$ (indicating integrated by two times).

As the scene continuously moves in the along-track direction $D_{a\_t}$ at the speed W/T, in the third image frame (e.g., including $F_{3\_1}$ and $F_{3\_2}$), the pixel data $2I_A$ associated with the object A already integrated in the integrator 31 is read out at first. Next, Stage1 senses pixel data of the position or object C of the scene, and integrates (or adds) to the integrator 31, e.g., shown as $I_C$; and Stage2 senses pixel data of the position or object B of the scene, and integrates (or adds) to the integrator 32, e.g., shown as $2I_B$ (indicating integrated by two times). When the scene is continuously imaged, the TDI CMOS image sensor 200 continuously integrates and reads pixel data using the process as shown in FIG. 3 to improve the SNR of the captured image frame.

In one aspect, the frame period T (or called exposure interval of one image frame) is larger than a summation of row exposure times for capturing all pixel rows of the pixel array 21 using the rolling shutter, e.g., FIG. 3 showing that an extra time $t_{extra}$ is left after a second pixel row of every image frame is exposed and read.

In one non-liming aspect, within a time difference (i.e. $t_{extra}$) between the frame period T and the summation of row exposure times, the image sensor 200 enters a sleep mode to save power.

In one non-liming aspect, a column analog-to-digital converter (ADC) (e.g., included in the readout circuit 23) of the TDI CMOS image sensor 200 performs, within the time difference $t_{extra}$, the analog-digital (AD) conversion on pixel signals of auxiliary pixels (e.g., dark pixels), external voltages or temperatures of an external temperature sensor of the pixel array 21. More specifically, within the time difference $t_{extra}$, the column ADC is used to perform the AD conversion on sensing signals outside the pixel columns 212 so as to broaden applications of the TDI CMOS image sensor 200. In this aspect, a line time is preferably set as the minimum time required for processing one row of pixel data.

In this embodiment, the readout circuit 23 samples every pixel using, e.g., correlation double sampling (CDS).

Please refer to FIG. 2 again, in another aspect, the separation space 2124 is equal to a summation of a pixel height W in the along-track direction $D_{a\_t}$ and a multiplication of the pixel height W by a time ratio of a line time difference t of the rolling shutter and a frame period T of capturing the image frame, i.e. separation space=W×(y+t/T).

Figure 4A:
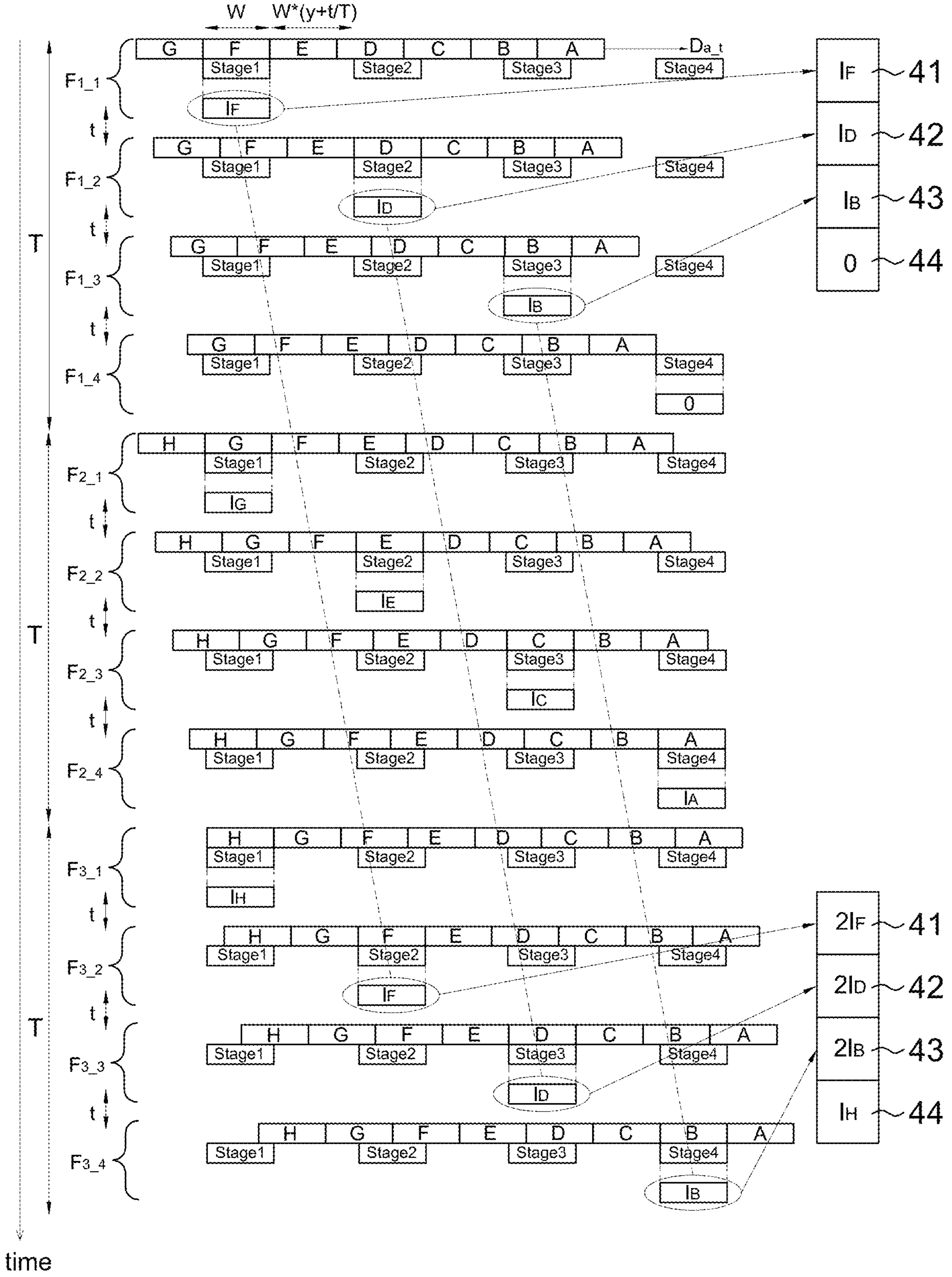
FIG. 4A is another operational schematic diagram of the TDI CMOS image sensor of FIG. 2.

Please refer to FIG. 4A together, it is another operational schematic diagram of the TDI CMOS image sensor 200 of FIG. 2. In FIG. 4A, it is assumed that one scene includes eight positions or objects A to H, and moves rightward (i.e. along-track direction $D_{a\_t}$). Stage1 to Stage 4 indicate four pixel rows of one pixel column 212, wherein the separation space W×(y+t/T) is arranged between two adjacent pixels, wherein y=0 or a positive integer. FIG. 4A shows an aspect that y=1; and an aspect of y=0 is shown in FIG. 3.

Because FIG. 4A assumes that the pixel array 21 includes four pixel rows, thus the frame period T of the TDI CMOS image sensor 200 for capturing one image frame includes four line times, which have a line time difference t from each other. For example, FIG. 4A shows that one image frame includes four pixel rows $F_{1\_1}$ to $F_{1\_4}$; a next image frame includes four pixel rows $F_{2\_1}$ to $F_{2\_4}$; and a further next image frame includes four pixel rows $F_{3\_1}$ to $F_{3\_4}$; and so on.

Similarly, the TDI CMOS image sensor 200 further includes multiple integrators, e.g., FIG. 4A showing four integrators 41 to 44. The integrator 41 is used to integrate pixel data in a first image frame (e.g., frame including $F_{1\_1}$ to $F_{1\_4}$) and a second image frame (e.g., frame including $F_{3\_1}$ to $F_{3\_4}$) corresponding to the same position (e.g., position or object F) of the scene, wherein the first image frame and the second image frame is separated by one image frame (e.g., frame including $F_{2\_1}$ to $F_{2\_4}$). The operations of other integrators 42 to 44 are identical to that of the integrator 41, and the difference is in integrating the pixel data at different positions or objects.

It is seen from FIG. 4A that a first pixel (e.g., Stage1) in the first image frame for sensing pixel data (e.g., $I_F$) of the same position (e.g., F) and a second pixel (e.g., Stage2) in the second image frame for sensing pixel data (e.g., $I_F$) of the same position (e.g., F) are two adjacent pixels of the same pixel column 212 in the pixel array 21. Therefore, the integrators (e.g., 41 to 44) do not integrate the pixel data $I_F$ in the first pixel and the second pixel corresponding to the same position within a frame period of the one image frame between the first image frame and the second image frame. The sensing and integration of positions or objects D and B are shown by dashed lines and arrows in FIG. 4A.

In the aspect of FIG. 4A, because the integrators 41 to 44 integrate pixel data in the image frames separated by one image frame (e.g., frame including $F_{2\_1}$ to $F_{2\_4}$) corresponding to the same position or the same object of a scene, if it is assumed that the pixel columns 212 have N pixels, the integrators 41 to 44 integrate N/2 times of pixel data corresponding to the same position or the same object of the scene.

The pixel data of the image frame $F_{2\_1}$ to $F_{2\_4}$ is integrated in another group of integrators, wherein the pixel data of the same position or the same object of the scene is also integrated by skipping one image frame (e.g., frame including $F_{3\_1}$ to $F_{3\_4}$).

When y=n, a same position of the scene is sensed by a next adjacent pixel of the same pixel column 212 after n image frames. As long as the control signal outputted by the control circuit 27 is properly arranged, the pixel data of the same position or object of the scene is accurately integrated in the same integrator.

Figure 4B:
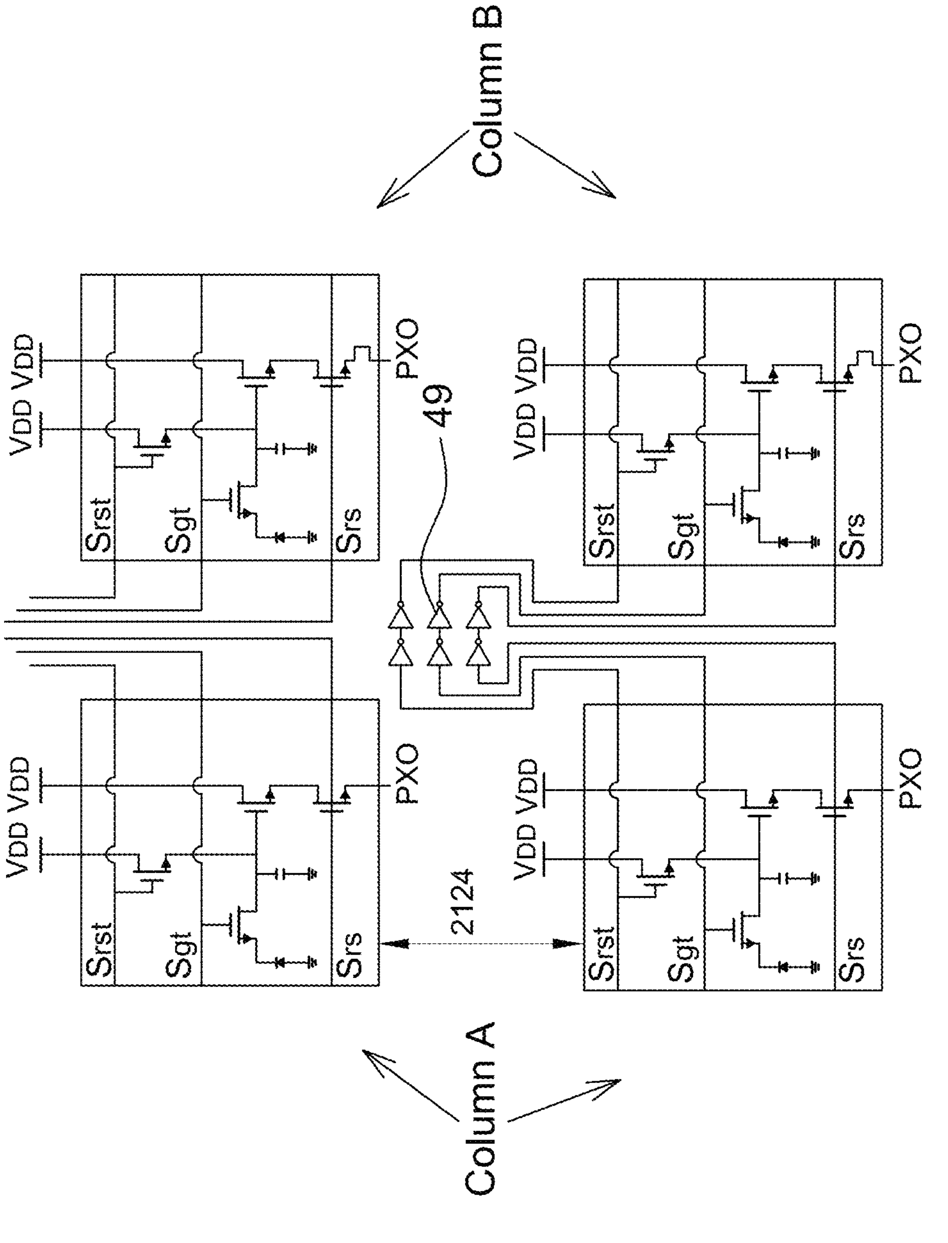
FIG. 4B is a schematic diagram of arranging buffers within the separation space of the TDI CMOS image sensor of FIG. 2.

In addition, in the aspect of FIG. 4A, because adjacent pixels of the pixel columns 212 have a larger separation space 2124, in the case that a wider imaged scene image is required, it is possible to arrange buffers in the separation space 2124 every predetermined number of pixel columns to buffer or amplify control signals of the pixel row. For example as shown in FIG. 4B, in the separation space 2124, the buffers 49 are arranged to buffer or amplify pixel control signals, e.g., including the reset signal Srst, signal transfer signal Sgt and row selection signal Srs, but not limited to. In this way, even a pixel array having a large number of pixel columns can still operate accurately.

Figure 5:
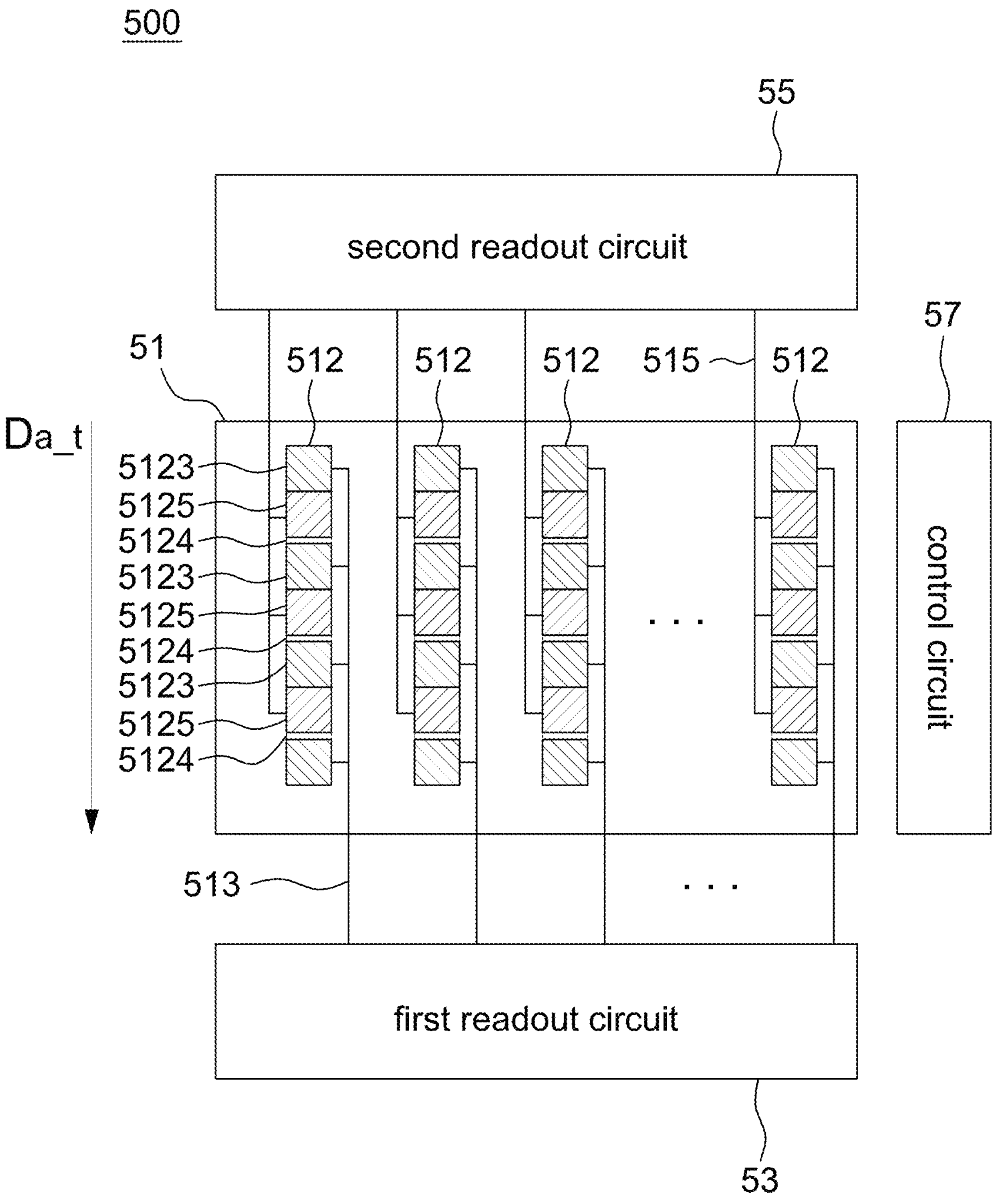
FIG. 5 is a schematic diagram of a TDI CMOS image sensor according to a second embodiment of the present disclosure.

Please refer to FIG. 5, it is a schematic diagram of a TDI CMOS image sensor 500 according to a second embodiment of the present disclosure. The TDI CMOS image sensor 500 is also captures an image frame using a rolling shutter, and moves toward an along-track direction $D_{a\_t}$ with respect to a scene.

The TDI CMOS image sensor 500 includes a pixel array 51. The pixel array 51 includes multiple pixel columns 512 each including multiple pixels arranged in the along-track direction $D_{a\_t}$. A separation space 5124 is arranged between two adjacent pixel groups to compensate a line time difference in using the rolling shutter, wherein each pixel group includes a first pixel 5123 and a second pixel 5215 directly connected to each other, i.e. no separation space 5124 therebetween.

The TDI CMOS image sensor 500 further includes a first readout circuit 53 and a second readout circuit 55. As shown in FIG. 5, the first readout circuit 53 is coupled to multiple first pixels 5123 in the pixel columns 512 via a readout line 513 so as to read pixel data of the first pixels 5123, and the second readout circuit 55 is coupled to multiple second pixels 5125 in the pixel columns 512 via a readout line 515 so as to read pixel data of the second pixels 5125.

Figure 6:
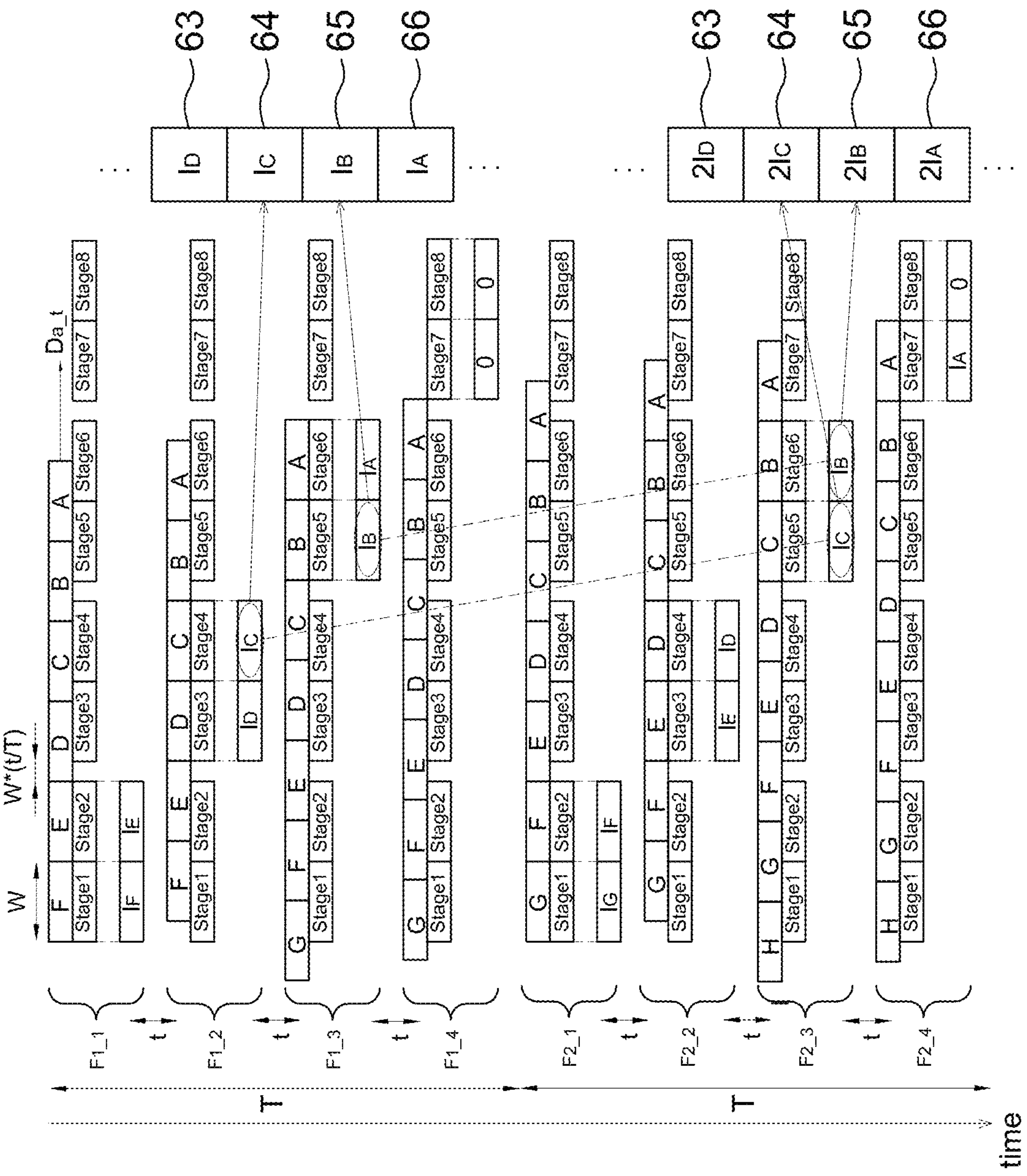
FIG. 6 is an operational schematic diagram of the TDI CMOS image sensor of FIG. 5.

Please refer to FIG. 6, it shows an operational schematic diagram of the TDI CMOS image sensor 500 in FIG. 5. In one aspect, the separation space 5124 is a multiplication of a pixel height W in the along-track direction $D_{a\_t}$ by a time ratio of a line time difference t of the rolling shutter and a frame period T of capturing the image frame (e.g., FIG. 6 showing two image frames), i.e. separation space=W×t/T.

In FIG. 6, it is assumed that a scene includes eight positions or objects A to H, and moves rightward (i.e. along-track direction $D_{a\_t}$).

In this embodiment, the readout circuits 53 and 55 uses, e.g., CDS to sample every pixel. In FIG. 6, Stage1 and Stage2, Stage3 and Stage 4, Stage5 and Stage 6, Stage7 and Stage 8 respectively indicate one pixel group of one pixel column 512, wherein Stage1, Stage3, Stage5 and Stage7 are first pixels 5123, and Stage2, Stage4, Stage6 and Stage8 are second pixels 5125. The separation space W×t/T is arranged between two adjacent pixel groups.

Because it is assumed that the pixel array 51 in FIG. 6 has four pixel groups in the along-track direction $D_{a\_t}$, a frame period T that the TDI CMOS image sensor 500 captures one image frame includes 4 line times, which have a line time difference t between each other. For example, FIG. 6 shows that a first image frame includes four rows of pixel groups $F_{1\_1}$ to $F_{1\_4}$; and a second image frame includes four rows of pixel groups $F_{2\_1}$ to $F_{2\_4}$.

In this embodiment, the first pixel 5123 and the second pixel 5125 of each pixel group are exposed simultaneously, and the pixel data thereof is respectively integrated by the first readout circuit 53 and the second readout circuit 55 simultaneously.

For example, in the line time of $F_{1\_2}$ of a first image frame (e.g., frame including $F_{1\_1}$ to $F_{1\_4}$), Stage3 and Stage4 are exposed at the same time, and pixel data of Stage3 (e.g., $I_D$) is integrated by the first readout circuit 53 to the integrator 63, and pixel data of Stage4 (e.g., $I_C$) is integrated by the second readout circuit 55 to the integrator 64. In the line time of $F_{1\_3}$ of the first image frame, Stage5 and Stage6 are exposed at the same time, and pixel data of Stage5 (e.g., $I_B$) is integrated by the first readout circuit 53 to the integrator 65, and pixel data of Stage6 (e.g., $I_A$) is integrated by the second readout circuit 55 to the integrator 66. The exposure and integration of other line times in a frame period T of the first image frame are similar to the line times $F_{1\_2}$ and $F_{1\_3}$.

For example, in the line time of $F_2$ 3 of a second image frame (e.g., frame including $F_{2\_1}$ to $F_{2\_4}$), Stage5 and Stage6 are exposed at the same time, and pixel data of Stage5 (e.g., $I_C$) is integrated by the first readout circuit 53 to the integrator 64, shown as $2I_C$ indicating integrated by two times; and pixel data of Stage6 (e.g., $I_B$) is integrated by the second readout circuit 55 to the integrator 65, shown as $2I_B$ indicating integrated by two times. The exposure and integration of other line times in a frame period T of the second image frame are similar to the line times $F_{2\_3}$.

For example, the first readout circuit 53 and the second readout circuit 55 are respectively coupled to each integrator via a switching device (e.g., a multiplexer, but not limited thereto). The switching device is controlled by a control signal (e.g., generated by the control circuit 57) to integrate pixel data read by the first readout circuit 53 or the second readout circuit 55 to the same integrator. It is appreciated that FIG. 6 shows only a part of integrators for describing the present disclosure.

More specifically, multiple integrators of the TDI CMOS image sensor 500 respectively store pixel data in the first image frame (e.g., frame including $F_{1\_1}$ to $F_{1\_4}$) and the second image frame (e.g., frame including $F_{2\_1}$ to $F_{2\_4}$), adjacent to each other, corresponding to the same position (e.g., B) of a scene, wherein in the first image frame, pixel data (e.g. $I_B$) corresponding to a same position (e.g., B) of the scene is read by the first readout circuit 53 and integrated to an integrator 65; and in the second image frame, the pixel data (e.g. Is) corresponding to the same position (e.g., B) of the scene is read by the second readout circuit 55 and integrated to the integrator 65. As long as the output signal of the control circuit 57 is corresponding arranged, the pixel data read from different readout circuits is correctly integrated in the same integrator. The method of integrating pixel data of associated pixels by other integrators is similar to the descriptions in this paragraph, and thus is not repeated herein.

In other aspects, the above embodiments of FIG. 2 and FIG. 5 are combinable. For example, a separation space between two adjacent pixel groups is a summation of a pixel height W and a multiplication of the pixel height W by a time ratio of a line time difference t of the rolling shutter and a frame period T of capturing the image frame, i.e. separation space=W×(y+t/T).

Figure 7:
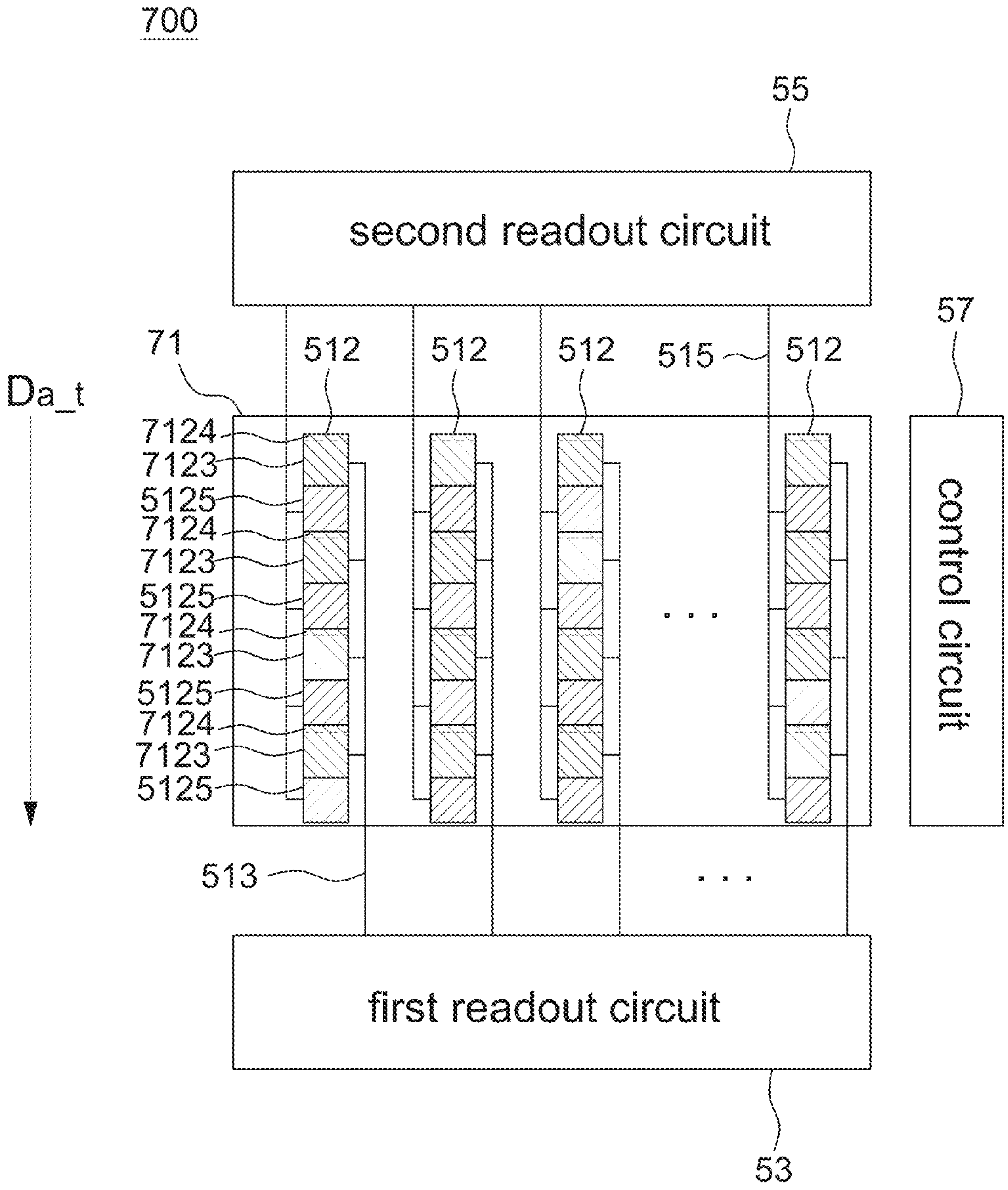
FIG. 7 is a schematic diagram of a TDI CMOS image sensor according to a third embodiment of the present disclosure.

Please refer to FIG. 7, it is a schematic diagram of a TDI CMOS image sensor 700 according to a third embodiment of the present disclosure. Similar to the TDI CMOS image sensors 200 and 500 mentioned above, the TDI CMOS image sensor 700 also captures image frames using a rolling shutter, and moves toward an along-track direction $D_{a\_t}$ with respect to a scene. In FIG. 7, components identical to those in FIG. 5 are indicated by the same reference numerals, and details thereof are not repeated herein.

The TDI CMOS image sensor 700 includes a pixel array 71. The pixel array 71 includes multiple pixel columns 512. Each of the pixel columns 512 includes multiple pixels arranged in the along-track direction $D_{a\_t}$. One pixel of each pixel group of the multiple pixels has an extension 7124 (e.g., equal to the separation space 5124 in FIG. 5, but not limited to) to compensate a line time difference of using the rolling shutter. Each of the pixel groups includes a first pixel 7123 and a second pixel 5125 directly adjacent to each other in the along-track direction $D_{a\_t}$, and adjacent pixel groups in the same pixel column are directly adjacent to each other in the along-track direction $D_{a\_t}$.

A length of the first pixel 7123 is longer than a length of the second pixel 5125 by the extension 7124 in the along-track direction $D_{a\_t}$ to increase the signal-to-noise ratio (SNR) of an image captured by the TDI CMOS image sensor 700.

In other words, each pixel column 512 of the pixel array 700 includes multiple pixel groups. Each of the multiple pixel groups includes a first pixel 7123 and a second pixel 5125. A length of a first aperture area of the first pixel 7123 is longer than a length of a second aperture area of the second pixel 5125 by the extension 7124. In the present disclosure, the first aperture area and the second aperture area are areas in the first pixel 7123 and the second pixel 5125 not being covered by opaque material and through which light can pass to impinge on the light sensing component (e.g., photodiodes or SPAD) therein.

In the third embodiment, since there are arranged with the extensions 7124 to compensate a line time difference of using the rolling shutter, two adjacent pixel groups do not have a separation space 5124 as shown in FIG. 5.

The TDI CMOS image sensor 700 further includes a first readout circuit 53 and a second readout circuit 55. As shown in FIG. 7, the first readout circuit 53 is coupled to multiple first pixels 7123 in the pixel columns 512 via a readout line 513 so as to read pixel data of the first pixels 7123, and the second readout circuit 55 is coupled to multiple second pixels 5125 in the pixel columns 512 via a readout line 515 so as to read pixel data of the second pixels 5125.

Figure 8:
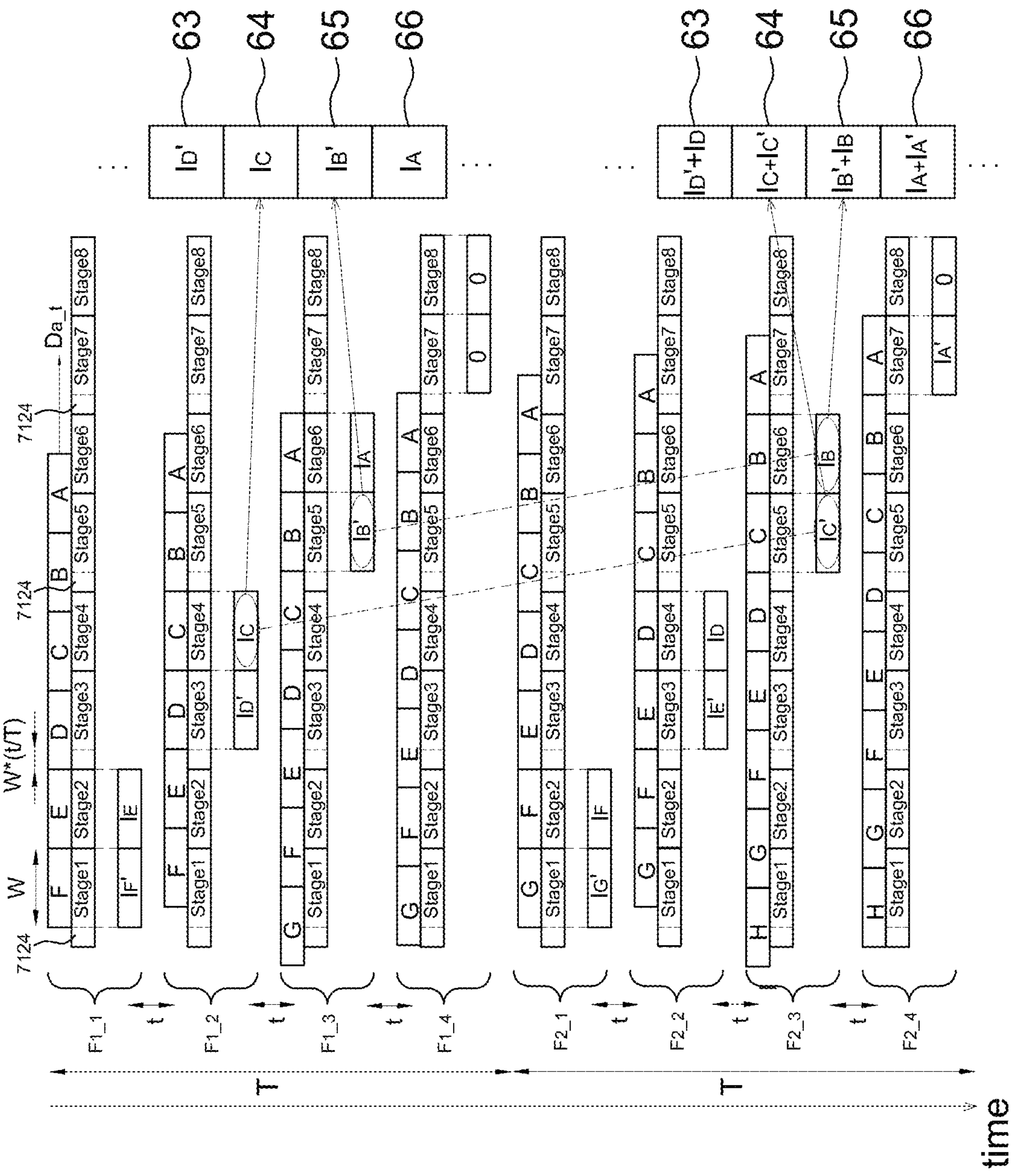
FIG. 8 is an operational schematic diagram of the TDI CMOS image sensor of FIG. 7.

Please refer to FIG. 8, it is an operational schematic diagram of the TDI CMOS image sensor 700 in FIG. 7. In one aspect, the extension 7124 is a multiplication of a pixel height W of pixels without the extension 7124 (i.e. the second pixels 5125) in the along-track direction $D_{a\_t}$ by a time ratio of a line time difference t of the rolling shutter and a frame period T of capturing the image frame (e.g., FIG. 8 showing two image frames), i.e. extension=W×t/T.

In FIG. 8, it is assumed that a scene includes eight positions or objects A to H, and moves rightward (i.e. along-track direction $D_{a\_t}$).

In this embodiment, the readout circuits 53 and 55 uses, e.g., CDS to sample every pixel. In FIG. 8, Stage1 and Stage2, Stage3 and Stage 4, Stage5 and Stage 6, Stage7 and Stage 8 respectively indicate one pixel group of one pixel column 512, wherein Stage1, Stage3, Stage5 and Stage7 are first pixels 7123, and Stage2, Stage4, Stage6 and Stage8 are second pixels 5125. FIG. 8 shows that the first pixels 7123 have an extension 7124 such that the first pixels 7123 are longer than the second pixels 5125 in the along-track direction $D_{a\_t}$.

Because it is assumed that the pixel array 71 in FIG. 8 has four pixel groups in the along-track direction $D_{a\_t}$, a frame period T that the TDI CMOS image sensor 700 captures one image frame includes 4 line times, which have a line time difference t between each other. For example, FIG. 8 shows that a first image frame includes four rows of pixel groups $F_{1\_1}$ to $F_{1\_4}$; and a second image frame includes four rows of pixel groups $F_{2\_1}$ to $F_{2\_4}$.

In this embodiment, the first pixel 7123 and the second pixel 5125 of each pixel group are exposed simultaneously, and the pixel data thereof is respectively integrated by the first readout circuit 53 and the second readout circuit 55 simultaneously.

For example, in the line time of $F_{1\_2}$ of a first image frame (e.g., frame including $F_{1\_1}$ to $F_{1\_4}$), Stage3 and Stage4 are exposed at the same time, and pixel data of Stage3 (e.g., $I_D$') is integrated by the first readout circuit 53 to the integrator 63, and pixel data of Stage4 (e.g., $I_C$) is integrated by the second readout circuit 55 to the integrator 64. In the line time of $F_{1\_3}$ of the first image frame, Stage5 and Stage6 are exposed at the same time, and pixel data of Stage5 (e.g., $I_B$') is integrated by the first readout circuit 53 to the integrator 65, and pixel data of Stage6 (e.g., $I_A$) is integrated by the second readout circuit 55 to the integrator 66. The exposure and integration of other line times in a frame period T of the first image frame are similar to the line times $F_{1\_2}$ and $F_{1\_3}$.

For example, in the line time of $F_2$ 3 of a second image frame (e.g., frame including $F_{2\_1}$ to $F_{24}$), Stage5 and Stage6 are exposed at the same time, and pixel data of Stage5 (e.g., $I_C$') is integrated by the first readout circuit 53 to the integrator 64, shown as $I_C$+$I_C$' indicating integrated by two times, wherein the pixel data $I_C$' is acquired by the second pixel 5125 in the first image frame and the pixel data $I_C$' is acquired by the first pixel 7123 in the second image frame; and pixel data of Stage6 (e.g., $I_B$) is integrated by the second readout circuit 55 to the integrator 65, shown as $I_B$'+$I_B$ indicating integrated by two times, wherein the pixel data $I_B$' is acquired by the first pixel 7123 in the first image frame and the pixel data $I_B$ is acquired by the second pixel 5125 in the second image frame. The exposure and integration of other line times in a frame period T of the second image frame are similar to the line times $F_{2\_3}$.

In FIG. 8, the pixel data detected by the first pixels 7123 are added with a symbol "'" to be distinguished from the pixel data (without the symbol "'") detected by the second pixels 5125, wherein because the first pixels 7123 have a larger aperture area, the pixel data added with the symbol "'" (e.g., $I_A$', $I_B$', $I_C$', $I_D$') has a better SNR than the pixel data without the symbol "'" (e.g., $I_A$, $I_B$, $I_C$, $I_D$).

For example, the first readout circuit 53 and the second readout circuit 55 are respectively coupled to each integrator via a switching device (e.g., a multiplexer, but not limited thereto). The switching device is controlled by a control signal (e.g., generated by the control circuit 57) to integrate pixel data read by the first readout circuit 53 or the second readout circuit 55 to the same integrator. It is appreciated that FIG. 8 shows only a part of integrators for describing the present disclosure.

More specifically, multiple integrators (e.g., 63 to 66 shown in FIG. 8) of the TDI CMOS image sensor 700 respectively store pixel data in the first image frame (e.g., frame including $F_{1\_1}$ to $F_{1\_4}$) and the second image frame (e.g., frame including $F_{2\_1}$ to $F_{2\_4}$), adjacent to each other, corresponding to the same position (e.g., B) of a scene, wherein in the first image frame, pixel data (e.g. $I_B$) corresponding to a same position (e.g., B) of the scene is detected by the first pixel 7123, read by the first readout circuit 53 and integrated to an integrator 65; and in the second image frame, the pixel data (e.g. $I_B$) corresponding to the same position (e.g., B) of the scene is detected by the second pixel 5125, read by the second readout circuit 55 and integrated to the integrator 65, wherein as $I_B$' has a better SNR, the SNR of $I_B$'+$I_B$ is also improved. As long as the output signal of the control circuit 57 is corresponding arranged, the pixel data read from different readout circuits is correctly integrated in the same integrator. The method of integrating pixel data of associated pixels by other integrators is similar to the descriptions in this paragraph, and thus is not repeated herein.

It should be mentioned that although FIG. 7 and FIG. 8 are described in the way that the first pixel 7123 has a larger aperture area than that of the second pixel 5125, the present disclosure is not limited thereto. In another aspect, the second pixel 5125 is arranged to have a larger aperture area (i.e. having an extension 7124 in the along-track direction) than that of the first pixel 7123.

In the third embodiment, among the integrated pixel data outputted by the integrators 63-66, a half pixel data is generated by the first pixels 7123 and the other half pixel data is generated by the second pixels 5125.

It should be mentioned that although FIG. 7 and FIG. 8 are described in the way that the first pixel 7123 is longer than the second pixel 5125 by W×(t/T) in the along-track direction $D_{a\_t}$, the present disclosure is not limited thereto. In another aspect, the first pixel 7123 is arranged to be longer than the second pixel 5125 by a pixel height of a pixel without the extension 7124 (i.e. the second pixel 5125) divided by N in the along-track direction $D_{a\_t}$, wherein N is a number of pixels in the pixel columns 512. That is, a length of an aperture area of the first pixel 7123 is longer than a length of an aperture area of the second pixel 5125 by a pixel height of pixels without the extension 7124 divided by N.

It is appreciated that values, e.g., including a number of pixels, integrators, and image frames and a length of extensions, in every embodiment and drawing of the present disclosure are only intended to illustrate but not to limit the present disclosure.

As mentioned above, when the CMOS image sensor adopting rolling shutter technique is applied to TDI imaging, the integrated pixel data is not exactly corresponding to the same position or object in a scene to generate distortion because the exposure of all pixels of a pixel array is not started and ended at the same time. Accordingly, the present disclosure further provides a TDI CMOS image sensor using a rolling shutter (e.g., FIG. 7) and an operating method thereof (e.g., FIG. 8) that compensate the line time difference of a rolling shutter, which causes distortion, and has the effect of increasing the aperture area by extending a length of a part of pixels in the along-track direction. By arranging the control signal of a control circuit correspondingly, pixel data of corresponding position is integrated to the associated integrator correctly.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A time delay integration (TDI) complementary metal-oxide-semiconductor (CMOS) image sensor, configured to capture an image frame using a rolling shutter and move with respect to a scene in an along-track direction, the image sensor comprising:

a pixel array, comprising multiple pixel columns, each of the pixel columns comprising multiple pixels arranged in the along-track direction, and one pixel of each pixel group of the multiple pixels having an extension in the along-track direction to compensate a line time difference of using the rolling shutter, wherein each pixel group has a first pixel and a second pixel, and the first pixel is longer than the second pixel by the extension in the along-track direction.

2. The image sensor as claimed in claim 1, wherein the image sensor further comprises:

a first readout circuit, coupled to the first pixel of the pixel group in the pixel columns, and configured to read pixel data of the first pixel; and a second readout circuit, coupled to the second pixel of the pixel group in the pixel columns, and configured to read pixel data of the second pixel.

3. The image sensor as claimed in claim 2, wherein the first pixel and the second pixel are directly adjacent to each other in the along-track direction, and adjacent pixel groups in the same pixel column are directly adjacent to each other without a separation space therebetween in the along-track direction.

4. The image sensor as claimed in claim 2, wherein the first pixel and the second pixel are exposed simultaneously, and pixel data of the first pixel and the second pixel are integrated simultaneously by the first readout circuit and the second readout circuit.

5. The image sensor as claimed in claim 2, wherein the image sensor further comprises multiple integrators configured to respectively store pixel data in a first image frame and a second image frame, adjacent to each other, corresponding to a same position of the scene, wherein the pixel data in the first image frame corresponding to the same position of the scene is read by the first readout circuit, and the pixel data in the second image frame corresponding to the same position of the scene is read by the second readout circuit.

6. The image sensor as claimed in claim 2, wherein the image sensor further comprises multiple integrators configured to respectively store pixel data in a first image frame and a second image frame, adjacent to each other, corresponding to a same position of the scene, wherein the pixel data in the first image frame corresponding to the same position of the scene is detected by the first pixel, and the pixel data in the second image frame corresponding to the same position of the scene is detected by the second pixel.

7. The image sensor as claimed in claim 1, wherein the line time difference is a time interval between a time of starting exposure of two adjacent pixel rows.

8. The image sensor as claimed in claim 1, wherein the extension is a multiplication of a pixel height of pixels without the extension in the along-track direction by a time ratio of the line time difference of the rolling shutter and a frame period of capturing the image frame.

9. The image sensor as claimed in claim 1, wherein the extension is a pixel height of pixels without the extension divided by N, and N is a number of pixels of each pixel column.

10. A time delay integration (TDI) complementary metal-oxide-semiconductor (CMOS) image sensor, configured to capture an image frame using a rolling shutter and move with respect to a scene in an along-track direction, the image sensor comprising:

a pixel array, comprising multiple pixel columns, each of the pixel columns comprising multiple pixels arranged in the along-track direction, and a first aperture area of a first pixel of each pixel group of the multiple pixels is longer than a second aperture area of a second pixel of the each pixel group by an extension in the along-track direction to compensate a line time difference of using the rolling shutter, wherein adjacent pixel groups in the same pixel column are adjacent to each other without a separation space therebetween in the along-track direction.

11. The image sensor as claimed in claim 10, wherein the image sensor further comprises:

a first readout circuit, coupled to the first pixel of the pixel group in the pixel columns, and configured to read pixel data of the first pixel; and a second readout circuit, coupled to the second pixel of the pixel group in the pixel columns, and configured to read pixel data of the second pixel.

12. The image sensor as claimed in claim 11, wherein the first pixel and the second pixel are directly adjacent to each other in the along-track direction.

13. The image sensor as claimed in claim 11, wherein the first pixel and the second pixel are exposed simultaneously, and pixel data of the first pixel and the second pixel are integrated simultaneously by the first readout circuit and the second readout circuit.

14. The image sensor as claimed in claim 11, wherein the image sensor further comprises multiple integrators configured to respectively store pixel data in a first image frame and a second image frame, adjacent to each other, corresponding to a same position of the scene, wherein the pixel data in the first image frame corresponding to the same position of the scene is read by the first readout circuit, and the pixel data in the second image frame corresponding to the same position of the scene is read by the second readout circuit.

15. The image sensor as claimed in claim 11, wherein the image sensor further comprises multiple integrators configured to respectively store pixel data in a first image frame and a second image frame, adjacent to each other, corresponding to a same position of the scene, wherein the pixel data in the first image frame corresponding to the same position of the scene is detected by the first pixel, and the pixel data in the second image frame corresponding to the same position of the scene is detected by the second pixel.

16. The image sensor as claimed in claim 10, wherein the line time difference is a time interval between a time of starting exposure of two adjacent pixel rows.

17. The image sensor as claimed in claim 10, wherein the extension is a multiplication of a pixel height of pixels without the extension in the along-track direction by a time ratio of the line time difference of the rolling shutter and a frame period of capturing the image frame.

18. The image sensor as claimed in claim 10, wherein the extension is a pixel height of pixels without the extension divided by N, and N is a number of pixels of each pixel column.

19. An image sensor, comprising:

a pixel array, comprising multiple pixel columns, each of the pixel columns comprising multiple pixel groups, each of the multiple pixel groups comprising a first pixel and a second pixel, wherein a first aperture area of the first pixel is longer than a second aperture area of the second pixel by an extension in a column direction of the multiple pixel columns to compensate a line time difference of using a rolling shutter;

a first readout circuit, coupled to first pixels of the multiple pixel groups in the multiple pixel columns, and configured to read pixel data of the first pixels; and a second readout circuit, coupled to second pixels of the multiple pixel groups in the multiple pixel columns, and configured to read pixel data of the second pixels, wherein adjacent pixel groups in the same pixel column are adjacent to each other without a separation space therebetween in the column direction.

20. The image sensor as claimed in claim 19, wherein the extension is a pixel height of the second pixel divided by N, and N is a number of pixels of each pixel column.

* * * * *